(12) United States Patent
Hiromatsu et al.

(10) Patent No.: US 9,746,764 B2
(45) Date of Patent: Aug. 29, 2017

(54) MASK BLANK AND TRANSFER MASK

(71) Applicants: HOYA CORPORATION, Tokyo (JP); NISSAN CHEMICAL INDUSTRIES, LTD., Tokyo (JP)

(72) Inventors: Takahiro Hiromatsu, Tokyo (JP); Masahiro Hashimoto, Tokyo (JP); Yasushi Sakaida, Toyama (JP); Ryuta Mizuochi, Toyama (JP); Rikimaru Sakamoto, Toyama (JP); Masaki Nagai, Tokyo (JP)

(73) Assignees: HOYA CORPORATION, Tokyo (JP); NISSAN CHEMICAL INDUSTRIES, LTD., Tokyo (JP)

( * ) Notice: Subject to any disclaimer, the term of this patent is extended or adjusted under 35 U.S.C. 154(b) by 2 days.

(21) Appl. No.: 15/031,877

(22) PCT Filed: Sep. 26, 2014

(86) PCT No.: PCT/JP2014/075594
§ 371 (c)(1),
(2) Date: Apr. 25, 2016

(87) PCT Pub. No.: WO2015/072232
PCT Pub. Date: May 21, 2015

(65) Prior Publication Data
US 2016/0274457 A1 Sep. 22, 2016

(30) Foreign Application Priority Data
Nov. 13, 2013 (JP) ................. 2013-235432

(51) Int. Cl.
*G03F 1/50* (2012.01)
*G03F 1/82* (2012.01)
*G03F 7/11* (2006.01)

(52) U.S. Cl.
CPC .................. *G03F 1/50* (2013.01); *G03F 1/82* (2013.01); *G03F 7/11* (2013.01)

(58) Field of Classification Search
CPC ..... G03F 1/50; G03F 1/82; G03F 7/11; H01L 21/027
USPC ............................................. 430/5
See application file for complete search history.

(56) References Cited

U.S. PATENT DOCUMENTS

| 5,583,063 | A | 12/1996 | Samoto |
| 2007/0190459 | A1 | 8/2007 | Hashimoto et al. |
| 2009/0047584 | A1 | 2/2009 | Hashimoto |

FOREIGN PATENT DOCUMENTS

| JP | S63-271334 A | 11/1988 |
| JP | H07-153666 A | 6/1995 |
| JP | 2007-171520 A | 7/2007 |
| JP | 2007-241259 A | 9/2007 |
| JP | 2011-164345 A | 8/2011 |

OTHER PUBLICATIONS

May 26, 2016 International Preliminary Report on Patentability issued in International Patent Application No. PCT/JP2014/075594.
Dec. 16, 2014 International Search Report issued in International Patent Application No. PCT/JP2014/075594.

*Primary Examiner* — Christopher Young
(74) *Attorney, Agent, or Firm* — Oliff PLC

(57) ABSTRACT

A mask blank, including: a thin film for forming a transfer pattern; a resist underlying film made of a resist underlying composition and provided on the thin film; a resist film made of a chemically amplified resist and provided on the resist underlying film; and a mixture film provided so as to be interposed between the resist underlying film and the resist film, wherein the resist underlying film is configured so that a molecular weight is reduced from the thin film side to the resist film side in a thickness direction, and has a low molecular weight region in which the molecular weight is low on the resist film side surface, and the mixture film is formed by mixing a component of the low molecular weight region and a component of the chemically amplified resist.

6 Claims, 7 Drawing Sheets

MASK BLANK AND TRANSFER MASK

TECHNICAL FIELD

The present invention relates to a mask blank and a transfer mask.

DESCRIPTION OF RELATED ART

Generally, a semiconductor pattern is formed using a photolithography method in a manufacturing step of a semiconductor device, and in a pattern transfer step for performing the photolithography method, a transfer mask is used. The transfer mask is manufactured by patterning a thin film (for example, a light shielding film) provided on a substrate, and forming a desired transfer pattern. In pattering of the transfer mask, a resist film is formed on the thin film, and thereafter the transfer pattern is formed using the resist film as a mask.

In recent years, as a semiconductor pattern becomes finer, a transfer pattern of the transfer mask used for the formation of the semiconductor pattern becomes also finer. Therefore, a chemically amplified resist is used for a mask blank, which is used for a fine processing technique of a semiconductor wafer. The chemically amplified resist generates an acid by exposure, and becomes a positive or a negative resist by a reaction between the acid and a functional group or a functional material controlling a solubility of a polymer, with this acid as a catalyst. Since the chemically amplified resist has a high sensitivity and resolution due to an acid-catalytic reaction, and therefore a fine pattern can be formed.

However, when the resist film made of chemically amplified resist, is formed just over the thin film (for example, light shielding film) for forming the transfer pattern, there is a problem that the resist film is inactivated. Specifically, in the resist film, the solubility is changed due to a generation of the acid-catalytic reaction by exposure. However, when the resist film is provided just over the light shielding film, the acid-catalytic reaction is inhibited. Probably, this is because when the surface of the thin film is made of a transition metal compound, the oxidized transition metal compound is exposed on the surface, and a base component is adsorbed on the oxide or a base component is generated in some way. Namely, when the acid generated during exposure of the resist film, is inactivated by inhibiting the reaction as a catalyst due to the basic component, or by a dispersion toward the light shielding film. Particularly, chromium is contained in the thin film, and when a chromium oxide is exposed on the surface, the above tendency is strong. As a result, the acid cannot sufficiently react during exposure in the resist film, and the resolution at the time of etching is reduced.

Therefore, in order to suppress an influence of the basic component contained in the light shielding film, a method of providing a resist underlying film between the light shielding film and the resist film, is proposed (for example, see patent documents 1 and 2). Namely, a mask blank is proposed, in which the light shielding film, the resist underlying film and the resist film are laminated on the substrate in this order. The resist underlying film suppresses a reaction between the basic component contained in the light shielding film and the acid generated in the resist film, or a dispersion of the acid toward the light shielding film, by being interposed between the light shielding film and the resist film. Thus, the resolution of the pattern of the resist film can be improved. In addition, since the resist underlying film is made of an organic substance, the resist underlying film has an excellent adhesion to the light shielding film and the resist film, and can maintain a high adhesion of the resist film. Although the resist underlying film does not show the solubility to a developing solution used for forming the pattern on the resist film, patterning is performed together by dry etching when etching is applied to the light shielding film, etc., using the resist film as a mask.

PRIOR ART DOCUMENT

Patent Document

Patent document 1: Japanese Patent Laid Open Publication No. 2007-241259
Patent document 2: Japanese Patent Laid Open Publication No. 2007-171520

SUMMARY OF THE INVENTION

Problem to be Solved by the Invention

However, when a resist underlying film is provided as described in patent documents 1 and 2, there is a problem that the resist film is remained in a portion (space portion) of the resist underlying film exposed by development, or leftovers of the resist film are re-attached thereto during washing. Such a state occurs when there is a high affinity between the resist underlying film and the resist film, thus making it easy for the resist film to adhere to the resist underlying film. Such a residue of the resist film becomes a foreign matter when forming a transfer pattern by developing a light shielding film, and therefore a defect caused by the foreign matter is generated in the manufactured transfer mask. Then, in the transfer mask, a pattern precision is reduced due to the defect caused by the foreign matter.

Therefore, an object of the present invention is to provide the mask blank having a high adhesion to the resist film, making it difficult for the foreign matter derived from the resist film to remain in the space portion during development thus having less defects caused by the foreign matter.

Means for Solving the Problem

As described above, the defect caused by the foreign matter generated when developing the mask blank, is generated when the foreign matter derived from the resist film remains in the space portion. Specifically, the defect caused by the foreign matter, is generated as shown in FIG. 7. In the mask blank, a space portion 120 is removed by development of a resist film 113, and a part of a resist underlying film 112 is exposed. However, there is a high affinity between a component of the resist film 113 and a component of the resist underlying film 112, and therefore the resist film 113 remains on the edge of the space portion 120 in some cases. Also, the leftovers of the resist film 113 removed by development, are re-attached onto the space portion 120 during washing as a foreign matter 130 in some cases. Due to such a foreign matter 130, a defect is generated in a transfer pattern, when forming the transfer pattern by applying etching to a thin film 111 using the resist film 113 as a mask. For example, there is a problem that a line edge roughness of the transfer pattern is increased by the foreign matter 130 that exists on the edge of the space portion 120, because the edge of the pattern of the resist film 113 is formed in an uneven shape. Further, for example, when washing is performed after development, the leftovers of the resist film 113 are washed away by washing, but if a droplet of a washing liquid remains on a substrate, the leftovers are precipitated by volatilization of the washing liquid, and re-attached to the space portion 120, etc., as the foreign matter 130. In such a case, the foreign matter 130 re-attaches along a flow of the washing liquid, thus generating the defect caused by the foreign matter.

Therefore, inventors of the present invention study on a technique of suppressing a residue of the foreign mater during development and reducing the defect caused by the foreign matter.

As a result, the inventors of the present invention obtain a knowledge that in the resist underlying film, it is preferable to reduce a molecular weight in a thickness direction and form a low molecular weight region on the resist film side. When the low molecular weight region is coated with a chemically amplified resist to provide the resist film, a mixture film in which the component of the resist underlying film and the component of the resist film are mixed, can be formed. Namely, the mixture film in which each component is mixed, can be formed on an interface between the resist underlying film and the resist film. The mixture film contains the component of the resist underlying film insolvable into a developing solution. However, the mixture film also contains the component of the resist film, and therefore similarly to the resist film, solubility to the developing solution is varied by exposure. Namely, when the mixture film contains a positive resist as the component of the resist film, the mixture film becomes insoluble to the developing solution if it is not exposed, and becomes soluble to the developing solution if it is exposed. On the other hand, when the mixture film contains a negative resist, the mixture film becomes soluble to the developing solution if it is not exposed, and an exposed region becomes insoluble.

In the mask blank including this mixture film, when the space portion of the resist film is dissolved and removed by development, a region positioned in the space portion of the resist film in the mixture film is also removed together. Thus, in the space portion, the resist film is floated by dissolving of the mixture film which is underlayer of the resist film, and is gouged and removed from the mixture film. Accordingly, in such a mask blank, when the resist film is developed, the foreign mater derived from the resist film, is prevented from remaining in the space portion.

Further, since the mixture film contains the components of the resist underlying film and the resist film, the mixture film has an excellent adhesion to each film. Therefore, it is possible to keep the adhesion of the resist film to a substrate.

Accordingly, in such a mask blank, the foreign matter is prevented from remaining in the space portion and the defect caused by the foreign matter is suppressed, and therefore the transfer mask manufactured from this mask blank has an excellent pattern precision.

The present invention is provided based on the above-mentioned knowledge, and has the following aspects.

(Aspect 1)

According to a first aspect of the present invention, there is provided a mask blank, including:

a thin film for forming a transfer pattern;

a resist underlying film made of a resist underlying composition and provided on the thin film;

a resist film made of a chemically amplified resist and provided on the resist underlying film; and a mixture film provided so as to be interposed between the resist underlying film and the resist film, wherein the resist underlying film is configured so that a molecular weight is reduced from the thin film side to the resist film side in a thickness direction, and has a low molecular weight region in which the molecular weight is low on the resist film side surface, and the mixture film is formed by mixing a component of the low molecular weight region and a component of the chemically amplified resist.

(Aspect 2)

According to a second aspect of the present invention, there is provided the mask blank of the first aspect, wherein a thickness of the mixture film is 0.1 nm or more and 10 nm or less.

(Aspect 3)

According to a third aspect of the present invention, there is provided the mask blank of the first or second aspect, wherein the resist underlying composition contains at least one kind or more of an organic solvent having a boiling point of 100° C. or more.

(Aspect 4)

According to a fourth aspect of the present invention, there is provided the mask blank of the third aspect, wherein the resist underlying composition contains a crosslinking agent, and a crosslinking start temperature is lower than the boiling point of at least one kind of the organic solvent.

(Aspect 5)

According to a fifth aspect of the present invention, there is provided the mask blank of any one of the first to fourth aspects, wherein the resist underlying composition contains a base polymer and a crosslinking catalyst, and contains 0.05 mass % or more and 10 mass % or less of the crosslinking catalyst based on 100 mass % of the base polymer.

(Aspect 6)

According to a sixth aspect of the present invention, there is provided a transfer mask, wherein a transfer pattern is formed on the thin film of the mask blank of any one of the first to fifth aspects.

Advantage of the Invention

According to the present invention, there is provided a mask blank having a high adhesion to a resist film, with a foreign matter derived from the resist film hardly remained in a space portion during development and less defects caused by the foreign matter, and is provided a transfer mask having an excellent pattern precision.

DETAILED DESCRIPTION OF THE INVENTION

An embodiment of the present invention will be described hereafter in the following order, with reference to the drawings.

1. Mask blank
2. Method of manufacturing a mask blank
3. Transfer mask and a method of manufacturing the same
4. Effect of this embodiment
5. Modified example, etc.

[1. Mask Blank]

Figure 1:
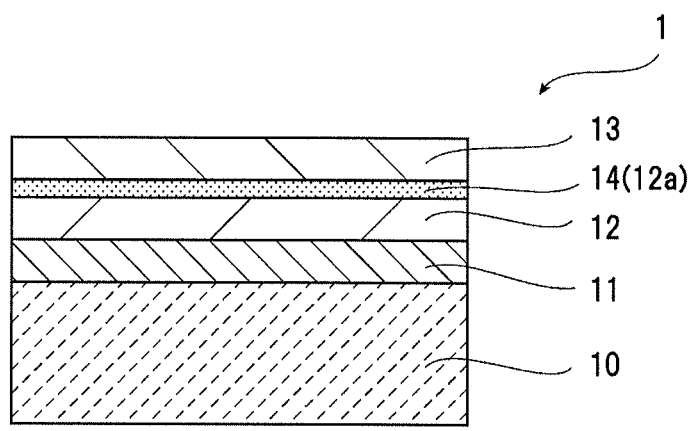
FIG. 1 is a schematic cross-sectional view of a mask blank according to an embodiment of the present invention.

A mask blank of this example will be described, using FIG. 1. FIG. 1 is a schematic cross-sectional view according to an embodiment of the present invention.

As shown in FIG. 1, a mask blank 1 of this embodiment has a thin film 11, a resist underlying film 12, and a resist film 13 on a substrate 10, and a mixture film 14 is formed so as to be interposed between the resist underlying film 12 and the resist film 13.

(Substrate 10)

The substrate 10 is not particularly limited, and a transparent substrate made of a quartz glass, or the other publicly-known substrate can be used.

(Thin Film 11)

The type of the thin film 11 is not particularly limited. When a binary mask blank is manufactured, a light shielding film is formed on the substrate 10 as the thin film 11. Also, when a phase shift-type mask blank is manufactured, a phase shift mask or the phase shift mask and the light shielding film are formed on the substrate 10 as the thin film 11. The thin film 11 may be a single layer or a multiple layer (for example, a lamination structure of the light shielding film and an antireflection layer). Further, when the light shielding film is formed as a lamination structure of the light shielding layer and the antireflection layer, the light shielding layer may have a structure composed of multiple layers. Further, the phase shift film and the etching mask film may also be a single layer or a multiple layer.

The binary mask blank includes for example: a binary mask blank having a light shielding film made of a material containing chromium (Cr), a binary mask blank having a light shielding film made of a material containing a transition metal and silicon (Si), a binary mask blank having a light shielding film made of a material containing tantalum (Ta), and a phase shift type mask blank having a phase shift film made of a material containing silicon (Si) or a material containing a transition metal and silicon (Si). The material containing the transition metal and silicon (Si) includes a material containing at least one element selected from the transition metal and silicon, and further containing at least one element of nitrogen, oxygen and carbon, other than the material containing the transition metal and silicon. Specifically, a material containing a transition metal silicide, or nitride, oxide, carbide, oxynitride, carbonitride, or carbooxynitride of the transition metal silicide, is suitable. Molybdenum, tantalum, tungsten, titanium, chromium, hafnium, nickel, vanadium, zirconium, ruthenium, rhodium, and niobium, etc., can be applied to the transition metal. Among them, especially, molybdenum is suitable.

Further, in the abovementioned binary mask blank and phase shift type mask blank, an etching mask film is provided on the light shielding film in some cases.

A material of the etching mask film is selected from a material having a resistance to an etchant used when patterning is applied to the light shielding film. When the material of the light shielding film is the material containing chromium (Cr), the material containing silicon (Si) for example is selected as the material of the etching mask film. Further, when the material of the light shielding film is the material containing silicon (Si), or the material containing the transition metal and silicon (Si), for example the material containing the abovementioned chromium is selected as the material of the etching mask film.

(Resist Underlying Film 12)

The resist underlying film 12 is the film for reducing an influence of a transition metal compound, particularly chromium oxide contained in the thin film 11, and suppressing an inactivation of the resist film 13. The resist underlying film 12 is formed and provided on the thin film 11, by coating the thin film 11 with a resist underlying composition and applying heat treatment thereto. The resist underlying film 12 is not dissolved into a developing solution used for forming the pattern on the resist film 13 (having a resistance), but is etched when dry etching is applied to the thin film 11, using the resist film 13 as a mask.

In this embodiment, the resist underlying film 12 is constituted so that a molecular weight is reduced in a thickness direction from the thin film 11 side toward the resist film 13 side, and has a low molecular weight region 12a in which the molecular weight is low, on the resist film 13 side surface. As described later, the low molecular weight region 12a is dissolved by the chemically amplified resist which becomes the resist film 13, and finally becomes a mixture film 14 in which the component of the dissolved low molecular weight region 12a and the component of the chemically amplified resist are mixed. The low molecular weight region 12a is the region of a low molecular weight dissolvable in the chemically amplified resist, and shows the region having a prescribed thickness from the surface of the resist film 13 side of the resist underlying film 12.

Here, the resist underlying film 12, and the resist underlying composition constituting the resist underlying film 12, will be specifically described.

The resist underlying composition contains a base polymer, a crosslinking agent, a crosslinking catalyst, and an organic solvent. In the resist underlying composition, the base polymer and other crosslinking agent, etc., are dissolved in the organic solvent. In the base polymer, generally there is a variation in the molecular weight, and the base polymer has a component of relatively large molecular weight (high molecular weight component) and a component of relatively small molecular weight (low molecular weight component). By heating the resist underlying composition and removing the organic solvent and simultaneously crosslinking the base polymer, the resist underlying film 12 is formed.

When the resist underlying composition is heated and crosslinked, conventionally, the substrate coated with the resist underlying composition is placed under a high temperature environment of a crosslinking start temperature (for example, 120° C.) or more, and quick heat treatment is applied thereto. Namely, the resist underlying composition is heated consistently under a relatively high temperature environment. In this case, the organic solvent is speedily removed under the high temperature environment, and a film is formed in a coexistence state of the low molecular weight component and a high molecular weight component of the base polymer. Thereafter, crosslink (polymerization) of the base polymer is advanced. As a result, the resist underlying film, which is formed by crosslinking, becomes the film in which there is a small variation of a crosslinking state (polymerization state) and there is a small variation of the molecular weight. Accordingly, the resist underlying film formed by quick heat treatment, becomes the film in which the molecular weight is uniform and relatively high in the thickness direction.

Meanwhile, in this embodiment, the resist underlying composition is not always heated at a high temperature, but is heated gradually by raising the temperature from a low temperature, as will be described later. In this case, since the organic solvent is not immediately removed, a crosslinking reaction is advanced in an existence state of the organic solvent (not removed completely). Namely, the base polymer starts to be crosslinked (polymerized) in a state in which it is dissolved in the organic solvent. At this time, the high molecular weight component starts to be crosslinked and coagulated, among the base polymers dissolved in the organic solvent. This is because when the high molecular component is polymerized, the molecule becomes huge, and a part of the huge molecule is in contact with and adsorbed on a coating surface (thin film 11). Namely, the degree of dissolving freedom of the high molecular weight components is immediately lost, and the high molecular weight components are aggregated downward. This situation repeatedly occurs, and due to the coagulation of the high molecular components, a film in which the high molecular components are crosslinked, is formed from a downside (the thin film 11 side). Meanwhile, although the low molecular weight component is crosslinked, the dissolved state in the organic solvent is easily maintained, and the low molecular weight component in this dissolved state is exuded above the film together with the organic solvent. When the temperature is raised after elapse of a heating time, the low molecular weight component starts to coagulate due to the crosslink. By this coagulation, the film in which the low molecular weight component is crosslinked, is formed into lamination. Accordingly, the resist underlying film 12 is formed. Thus, the resist underlying film 12 is formed as a lamination of the film in which the low molecular weight component is crosslinked on the film in which the high molecular weight component is crosslinked. The film in which the high molecular weight component is crosslinked, has a high degree of crosslink, with a molecule enlarged, because the crosslink is carried out under crosslinking agent-rich environment at an initial time of heating. On the other hand, regarding the film in which the low molecular weight component is crosslinked, the molecule is not enlarged in the film coagulated previously, because the film is crosslinked under an environment in which the crosslinking is advanced and the crosslinking agent is consumed (the amount of the crosslinking agent is small). Accordingly, the resist underlying film 12 becomes the film in which the molecular weight is reduced in a thickness direction toward the resist film 13 side from the thin film 11 side, and the low molecular weight region 12a is formed on the resist film 13 side.

As described above, when the resist underlying film 12 is formed, the temperature is gradually raised to carry out heating and crosslinking, and the heating and crosslinking is carried out so as not to allow the organic solvent to be completely volatilized. Therefore, from a viewpoint of suppressing the volatilization of the organic solvent, a boiling point of the organic solvent contained in the resist underlying composition, is preferably higher than a crosslinking start temperature. This is because by setting the boiling point to be high, the volatilization of the organic solvent by setting the boiling point to be high, the volatilization of the organic solvent is suppressed at the time of a temperature rise, to thereby make it easy to form the low molecular weight region 12a. As the boiling point of the organic solvent, at least 100° C. is preferable, and 115° C. or more and 180° C. or less is more preferable. When the boiling point is less than 100° C., the organic solvent is quickly volatilized, and there is a possibility that a molecular weight distribution is not successfully generated in the formed resist underlying film 12. On the other hand, when the boiling point exceeds 180° C., long time heating at a high temperature must be carried out for volatilizing the organic solvent, thus involving a problem that the base polymer is excessively heated.

As such an organic solvent, ketones such as cyclohexanone (boiling point: 155° C.), alcohols and ethers such as 3-methoxy butanol (boiling point 158° C.), 3-methyl-3-methoxy-butanol (boiling point 173° C.), PGME (1-methoxy-2-propanol) (boiling point 118° C.), ethylene glycol monomethyl ether (boiling point 124.5° C.), propylene glycol mono ethyl ether (boiling point 132° C.), and diethylene glycol dimethyl ether (boiling point 162° C.), and esters such as PGMEA (2-(1-methoxy) propyl acetate) (boiling point 146° C.), ethyl lactate (boiling point 155° C.), butyl acetate (boiling point 126° C.), and 3-methoxy-propionic acid methyl (boiling point 143° C.), can be given, and although one kind or two kinds or more can be mixed and used, the organic solvent is not limited thereto. In the present invention, for example, PGME (1-methoxy-2-propanol), PGMEA (2-(1-methoxy) propyl acetate), or the like can be preferably used. When the organic solvent of a mixed solvent is used, at least one organic solvent in the vicinity of the crosslinking start temperature of the resist underlying composition (for example, in a range of T−10° C. to T+3° C. when the crosslinking start temperature is T° C.) is preferably mixed by 10 to 60 mass %, and preferably 25 to 50 mass %. When such a mixed solvent is used, due to the volatilization of the solvent component, a slow state of the reaction velocity in the vicinity of the crosslinking start temperature is continued, and the low molecular weight component of the base polymer is pushed-up on top of the layer, and this is preferable.

Further, from a viewpoint of performing heat treatment so as not allow the organic solvent to be volatilized, the crosslinking start temperature of the resist underlying composition (at least one kind of organic solvent when it is the mixed solvent) is preferably a lower temperature than a boiling point, and crosslinking may be performed under a low temperature environment. The crosslinking start temperature is varied depending on the kind of the base polymer or the crosslinking agent. For example, when the mixed solvent of PGME (boiling point: 118° C.) and PGMEA (boiling point: 146° C.) is used, the crosslinking start temperature is not particularly limited, but is preferably set to 145° C. or less, and more preferably set to 100° C. or more and 125° C. or less. In a case of a system having such a crosslinking start temperature, the crosslinking temperature is not particularly limited.

Further, a crosslinking catalyst is contained in the resist underlying composition, and when the base polymer is a novolac resin, an acidic catalyst is selected. As the acidic catalyst, organic acids including sulfonic acid such as para-toluene sulfonic acid and carboxylic acid such as benzoic acid, and inorganic acids such as hydrochloric acid and sulfuric acid, can be given, and preferably organic acid can be given. It is also possible to use the acid generated by mixing a photoacid generator such as 2-(p-methoxyphenyl)-4, 6-bis(trichloromethyl)-1,3,5-triazine, and applying light irradiation thereto.

Note that, due to the kind of the crosslinking catalyst and pH of the resist underlying composition, the crosslinking reaction velocity is varied. Therefore, depending on the kind and the content of the crosslinking catalyst, probably a thickness of the low molecular weight region 12a is also varied. Specifically, when the crosslinking reaction velocity is large (for example, when the content of the crosslinking catalyst is large), the low molecular weight component is easily coagulated together with the high molecular weight component, and therefore variation of the molecular weights becomes small, and the thickness of the low molecular weight region 12a is reduced. Meanwhile, when the reaction velocity is slow (for example, when the content is small), coagulation of the low molecular weight component hardly occurs, and therefore the thickness of the low molecular weight region 12a is increased.

Therefore, the resist underlying composition preferably contains 0.05 mass % or more and 10 mass % or less, and preferably 0.05 mass % or more and 3 mass % or less of the crosslinking catalyst based on 100 mass % of the base polymer. Note that when an amount of the crosslinking catalyst is excessively larger than the amount of the base polymer, a molecular weight distribution of the base polymer is hardly formed on top and bottom of the film. When the amount of the crosslinking agent is excessively small, the thickness of a non-crosslinked low molecular weight (portion dissolved into a resist layer) becomes excessively large, thus involving a problem that resolution accuracy becomes poor when a resist pattern is formed.

Thus, the mixture film 14 can be formed having a thickness of 0.1 nm or more and 10 nm or less for example.

The base polymer in the resist underlying composition is not particularly limited, and a publicly-known resin component can be used. As the base polymer, for example, novolak resin and acrylic resin can be given.

(Resist Film 13)

The resist film 13 functions as a mask when a prescribed resist pattern is formed and patterning is applied to the thin film 11. The resist film 13 is formed by coating the surface of the low molecular weight region 12a of the resist underlying film 12, with a chemically amplified resist, and applying heat treatment thereto, so as to be provided on the resist underlying film 12. As will be described later, by dissolving the low molecular weight region 12a, the chemically amplified resist actions to form a mixed component mixed into the low molecular weight region 12a. The mixed component finally becomes the mixed film 14 by heating and crosslinking.

(Mixed Film 14)

The mixed film 14 is provided so as to be interposed between the resist underlying film 12 and the resist film 13, and is formed by the mixed component in which the component of the low molecular weight region 12a of the resist underlying film 12 and the component of the chemically amplified resist are mixed. A mechanism of forming the mixed film 14 is estimated as follows.

When the resist film 13 is formed, the chemically amplified resist is applied on the resist underlying film 12, but in this embodiment, the low molecular weight region 12a is positioned on the coating surface. The organic solvent is contained in the chemically amplified resist, and the low molecular weight region 12a is dissolved by the organic solvent. By such dissolving, the mixed component is formed, in which the component of the low molecular weight region 12a and the chemically amplified resist are mixed. By heating and crosslinking the mixed component during heating and crosslinking of the chemically amplified resist, the mixed component becomes the mixed film 14.

Although the mixed film 14 contains the component of the resist underlying film 12, the mixed film 14 shows a similar solubility into a developing solution as the solubility of the resist film 13, because the component of the resist film 13 is contained therein. For example, when the component of the resist film 13 is a positive resist, the component of the positive resist is contained in the mixed film 14. The mixed film 14 shows a similar solubility into the developing solution as the solubility of the positive resist, and an unexposed region becomes insoluble into the developing solution, and an exposed region becomes soluble into the developing solution. Further, when the component of the resist film 13 is a negative resist, the component of the negative resist is contained in the mixed film 14, and therefore the unexposed region becomes soluble into the developing solution, and the exposed region becomes insoluble into the developing solution.

Figure 3:
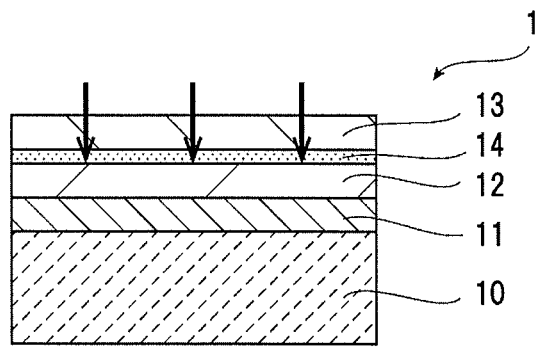
FIG. 3(a) to FIG. 3(d) are step views showing the manufacturing steps of a transfer mask according to an embodiment of the present invention.
Figure 3:
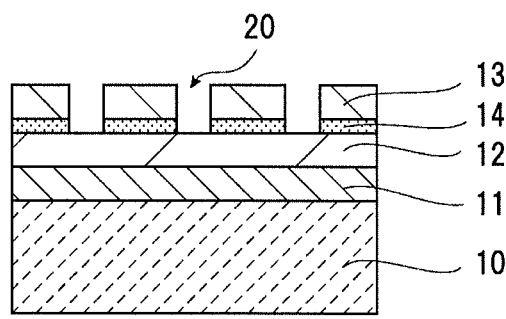
Figure 3:
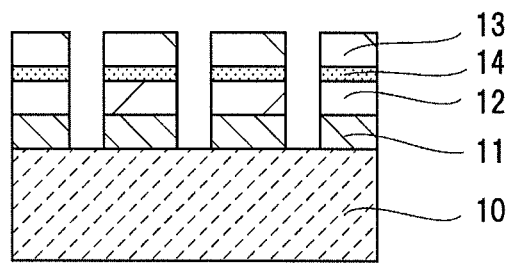
Figure 3:
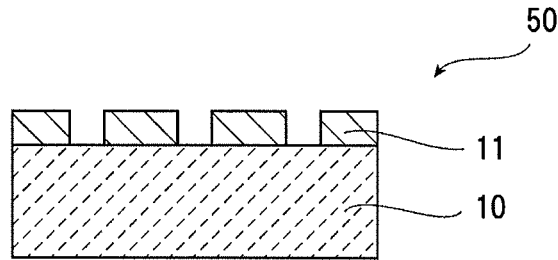

Such a mixed film 14 is removed together with the resist film 13, when the resist film 13 is developed. Specifically, as shown in FIG. 3(b) described later, when the resist film 13 is developed, a space portion 20 is removed, and the resist pattern is formed. At this time, the region of the space portion 20 of the mixed film 14 is also removed. Thus, in the region of the space portion 20, the mixed film 14 which is the underlayer of the resist film 13 is dissolved and removed, to thereby float the resist film 13, which is then removed so as to be gouged from the mixed film 14. Namely, the mixed film 14 is removed from the space portion 20 by floating the resist film 13 which is the upper layer, by dissolving during development (lift-off effect).

Accordingly, owing to the mixed film 14, foreign matters derived from the resist film 13 can be prevented from remaining in the space portion 20. Note that a line portion area of the resist pattern of the mixed film 14 is insoluble into the developing solution, and therefore the resist pattern of the resist film 13 is not lifted-off by the developing solution.

Further, the mixed film 14 contains the component of the resist film 13, and therefore has a good wettability to the developing solution, and has a good permeability to the developing solution. In addition, the mixed film 14 is made of an organic matter, and therefore has a good adhesion to the resist underlying film 12 and the resist film 13, and can maintain a high adhesion to the mask blank 1 of the resist film 13.

The thickness of the mixed film 14 corresponds to the thickness of the low molecular weight region 12a. As the thickness of the low molecular weight region 12a is larger, the thickness of the mixed film 14 becomes large. Although the thickness of the mixed film 14 is not particularly limited, the thickness is preferably 0.1 nm or more and 10 nm or less.

[2. Method of Manufacturing a Mask Blank]

A method of manufacturing the mask blank 1 will be described next, with reference to FIGS. 2(a) to (e). FIGS. 2(a) to (e) are step views showing the manufacturing steps of the mask blank according to an embodiment of the present invention.

Figure 2:
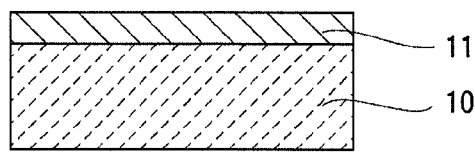
FIG. 2(a) to FIG. 2(e) are step views showing the manufacturing steps of the mask blank according to an embodiment of the present invention.
Figure 2:
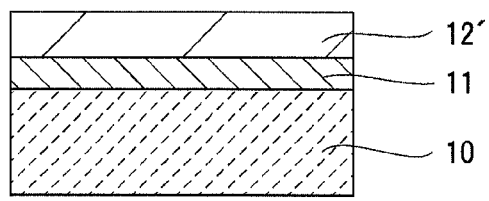
Figure 2:
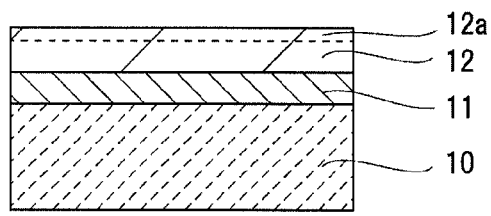
Figure 2:
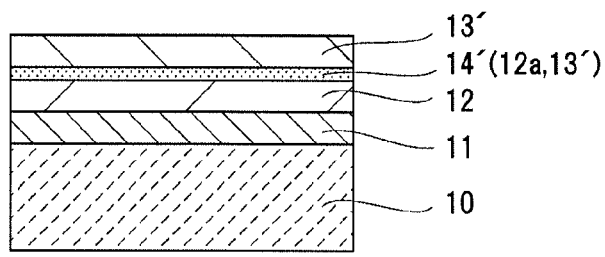
Figure 2:
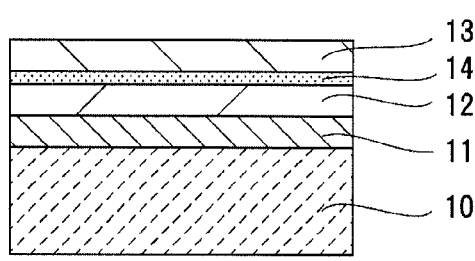

First, as shown in FIG. 2(a), the thin film 11 for forming a transfer pattern is formed on the substrate 10, by a sputtering method for example.

Next, as shown in FIG. 2(b), a resist underlying composition 12' is applied on the thin film 11 by spin coating for example.

Subsequently, as shown in FIG. 2(c), the resist underlying composition 12' is crosslinked by heating. In this embodiment, preferably the temperature is raised from a low temperature to a high temperature, and the resist underlying composition 12' is gradually heated. Specifically, the temperature of the resist underlying composition 12' is raised from a lower temperature (first temperature) than the boiling point of the organic solvent contained in the resist underlying composition 12' to a higher temperature (second temperature) than the crosslinking start temperature of the resist underlying composition 12', and the resist underlying composition 12' is heated at the second temperature. When the temperature reaches the second temperature, heating is stopped, and the second temperature is maintained for a prescribed time for heating. Thus, the base polymer is crosslinked and the organic solvent is volatilized, to thereby form the resist underlying film 12.

In a process of raising the temperature from the first temperature to the second temperature, for example, temperature rise/heating is performed gradually from the first temperature to the second temperature for a prescribed time. When the resist underlying composition 12' is gradually heated, volatilization of the organic solvent can be suppressed, compared to a case that heating (quick heating) at the second temperature is performed from the first. Therefore, crosslinking of the resist underlying composition 12' is advanced under an environment in which the organic solvent exists. Under such an environment, the component of the base polymer having a relatively large molecular weight starts to be crosslinked and coagulated first, and thereafter the component having a relatively small molecular weight starts to be coagulated. By such coagulation, a lamination structure is formed on the resist underlying film 12, so that the film in which the high molecular weight component is crosslinked, and the film in which the low molecular weight component is crosslinked, are sequentially laminated from the thin film 11 side.

The resist underlying film 12 is constituted as a lamination of the film in which the high molecular weight component is crosslinked and the film in which the low molecular weight component is crosslinked, in this order. Since the high molecular weight component is crosslinked under a crosslinking agent-rich environment at an initial time of heating, the crosslinking degree is high, and the molecule is huge (polymerized). On the other hand, the low molecular weight component is crosslinked under an environment in which the crosslinking agent is consumed due to advancement of the crosslinking, and therefore the higher molecular weight component is not polymerized. As a result, as shown in FIG. 2(c), the resist underlying film 12 is constituted so that the molecular weight is reduced in a thickness direction from the thin film 11 side to the front surface side, and has the low molecular weight region 12a in which the molecular weight is low.

The first temperature is set as a lower temperature than the boiling point of the organic solvent contained in the resist underlying composition 12', which is the temperature for starting heating of the resist underlying composition. The first temperature is a room temperature (23° C.) for example. Further, the second temperature is the temperature after being raised, and set as a higher temperature than the crosslinking start temperature of the resist underlying composition 12'. The crosslinking start temperature is different depending on the kind of the crosslinking agent or the base polymer, and therefore the second temperature can be varied depending on the kind of the crosslinking agent and the base polymer.

Further, when the temperature is raised from the first temperature to the second temperature, heating is preferably performed at a heating rate of 80° C./min or less and particularly preferably heating is performed at 50° C./min or less from a viewpoint of gradually advancing the crosslinking reaction. If the heating rate exceeds 80° C./min, the crosslinking reaction is quickly advanced, and a layer entire body becomes a uniform crosslinked state before the low molecular weight components are collected in an upper part. Although the heating rate is not required to be uniform, the heating rate is preferably the rate so that the low molecular weight components can be dispersed upward in the vicinity of the crosslinking start temperature.

Subsequently, as shown in FIG. 2(d), a chemically amplified resist 13' is applied on the resist underlying film 12 by spin coating for example. The low molecular weight region 12a is formed on the surface of the resist underlying film 12 coated with the chemically amplified resist 13', and the chemically amplified resist 13' is applied so as to coat the low molecular weight region 12a. At this time, the low molecular weight region 12a is dissolved by the chemically amplified resist 13'. By such dissolving, a mixed component 14' in which the component of the low molecular weight region 12a and the component of the chemically amplified resist 13' are mixed, is formed on an interface between the resist underlying film 12 and the chemically amplified resist 13'.

Subsequently, as shown in FIG. 2(e), the chemically amplified resist 13' is heated and crosslinked, to thereby form the resist film 13. At this time, the mixed component 14' is also simultaneously heated and crosslinked, to thereby form the mixed film 14. The mixed film 14 is formed on the interface between the resist underlying film 12 and the resist film 13.

As described above, the mask blank 1 of this embodiment is obtained.

[3. Transfer Mask]

Next, the transfer mask and the method of manufacturing the same according to this embodiment will be described, with reference to FIG. 3(a) to FIG. 3(d). FIG. 3(a) to FIG. 3(d) are step views showing the manufacturing steps of the transfer mask according to an embodiment of the present invention.

The transfer mask of this embodiment is manufactured by forming a prescribed pattern on the abovementioned mask blank. Explanation will be given hereafter for a case that the resist film 13 contains a positive resist component.

First, as shown in FIG. 3(a), exposure is performed to the mask blank 1, so as to correspond to the prescribed pattern. By the exposure, exposed portions of the resist film 13 and the mixture film 14 become soluble into the developing solution.

Subsequently, as shown in FIG. 3(b), the mask blank 1 is developed. By the development, a prescribed resist pattern is formed on the resist film 13 and the mixture film 14. In this development, there is a high affinity between the component derived from the resist film 13 and the resist underlying film 12, and therefore there is a possibility that the component derived from the resist film 13 remains in the space portion 20 of the resist pattern. Further, the leftovers of the resist film 13 removed by development, are dispersed in the washing liquid, etc. However, if a droplet, etc., of the washing liquid remains on the surface of the substrate, there is a possibility that the leftovers are precipitated by volatilization of the washing liquid and re-adhered on the space portion 20.

However, in this embodiment, the mixture film 14 is provided so as to be interposed between the resist underlying film 12 and the resist film 13, and the mixture film 14 is dissolved into the developing solution, so that the resist film 13 is gouged. Thus, the component (foreign matter) derived from the resist film 13, is removed from the space portion 20 together with the mixture film 14, and the foreign matter is prevented from remaining in the space portion 20. Further, in the space portion 20 from which the mixture film 14 is removed, most of the leftovers of the resist film 13 is excluded from the surface of the substrate, together with the developing solution. Due to a small number of the resist films 13 remained on the substrate 10 in the stage of the washing step, re-adhesion is suppressed in the washing step. Therefore, the resist film 13 has a high resolution, and has an excellent line edge roughness of the space portion 20.

In the mixture film 14 containing the positive resist component, the exposed area is soluble in the developing solution, and an unexposed area is insoluble in the developing solution. When the mixture film 14 is developed, only the exposed area of the mixture film 14 is scraped off in a thickness direction. Namely, the mixture film 14 is not scraped off from the space portion 20 in a surface direction. Therefore, the adhesion of the unexposed and remained resist film 13 to the resist underlying film 12, is not damaged.

Subsequently, as shown in FIG. 3(c), the resist underlying film 12 and the thin film 11 are etched, using the resist film 13 as a mask, on which the prescribed resist pattern is formed. By the etching, a prescribed transfer pattern is formed on the thin film 11. Then, as shown in FIG. 3(d), by removing the resist film 13, etc., a transfer mask 50 of this embodiment is obtained. The transfer pattern of the transfer mask 50 is formed by a resist pattern with less remaining of the foreign matter, and therefore the defect caused by the foreign matter is reduced. In addition, the line edge roughness is excellent. Accordingly, the transfer mask 50 of this embodiment has a high pattern precision.

In addition, in this embodiment, explanation is given for a case that the resist film 13 contains the positive resist component. However, the present invention is not limited thereto. Even in a case that the resist film 13 contains a negative resist component, a similar effect can be obtained.

[4. Effect of this Embodiment]

According to this embodiment, the following one or a plurality of effects can be exhibited.

The mask blank of this embodiment includes the mixture film 14 in which the component of the low molecular weight region 12a of the resist underlying film 12 and the component (chemically amplified resist) of the resist film 13 are mixed, between (interface) of the resist underlying film 12 and the resist film 13. The mixture film 14 is soluble in the developing solution for developing the resist film 13, and has a high permeability into the developing solution. Therefore, the mixture film 14 is capable of making the resist film 13 floated by dissolving during development, and removing the resist film 13 from the space portion 20. Therefore, according to the mask blank 1 of this embodiment, when the resist film 13 is developed, the foreign matter derived from the resist film 13 is prevented from remaining in the space portion 20, and the defect caused by the foreign matter is reduced.

Further, the droplet, etc., of the developing solution in which the leftovers of the resist film 13 after development are dispersed, is prevented from remaining in the space portion 20 from which the mixture film 14 is removed. Namely, the leftovers are discharged to outside of the substrate together with the developing solution, and re-adhesion to the space portion 20 is suppressed. Therefore, according to the mask blank 1, when the resist film 13 is developed, remaining of the foreign matter such as leftovers can be reduced, and therefore the defect caused by the foreign matter can be reduced. For example, in a spin washing, there is a possibility that the leftovers are re-adhered in a spiral shape, to thereby cause the defect by the foreign matter to be generated. However, according to this embodiment, such a state can be suppressed.

Further, the mixture film 14 is made of the mixture component in which the component of the resist underlying film 12 and the component of the resist film 13 are mixed. Therefore, the mixture film 14 has an excellent adhesion to the resist underlying film 12 and the resist film 13, and a high adhesion of the resist film 13 to the mask blank 1 can be maintained.

In the transfer mask 50 of this embodiment, the defect caused by the foreign matter is suppressed, and the transfer pattern has an excellent line edge roughness. Therefore, the transfer mask 50 has a high pattern precision.

[5. Modified Example, Etc.]

In the abovementioned embodiment, explanation is given for a case that the low molecular weight region is coated with the chemically amplified resist to form the mixture component, and thereafter, simultaneously with heating and crosslinking of the chemically amplified resist, the mixed component is heated and crosslinked, to thereby form the mixture film. However, in the present invention, the method of forming the mixture film is not limited thereto. For example, the mixture film may be formed in such manner that the component of the resist underlying film (resist underlying film composition) and the component of the resist film (chemically amplified resist) are prepared in advance, and the mixed component is applied, heated and crosslinked on the resist underlying film, as a coating liquid. Although the mixing ratio of the resist underlying film composition and the chemically amplified resist is not particularly limited, for example, 1:9 to 9:1 is preferable, and 1:4 to 4:1 is more preferable. In the present invention, the mask blank having both components of the resist underlying film and the resist film, is included between the resist underlying film and the resist film.

EXAMPLE

The present invention will be described hereafter based on further detailed examples. However, the present invention is not limited to these examples.

Example 1

In the present invention, the mask blank and the transfer mask are manufactured, and evaluation is performed to each of them.

(Manufacture of the Mask Blank)

First, a light semi-transmitting film, a light shielding film and a hard mask were respectively formed on the substrate by a sputtering method. Specifically, MoSiN film (having a thickness of 69 nm) of a single layer was formed on a transparent substrate as the light semi-transmitting film. Subsequently, three layers of CrOCN layer (having a thickness of 30 nm), CrN layer (having a thickness of 4 nm), and CrOCN layer (having a thickness of 14 nm) were formed in this order as the light shielding film. Subsequently, the hard mask (having a thickness of 10 nm) was formed. Then, HMDS processing was applied to the surface of the formed thin film under a prescribed condition. In this example, the transparent substrate made of a quartz glass was used as the substrate.

Next, the surface of the thin film was coated with the resist underlying composition by a spin coating method. The resist underlying composition used here, contains the following components.

Base polymer: novolac-based polymer
Organic solvent: mixed solvent of 1-methoxy-2-propanol (PGME) (boiling point 118° C.) and 2-(1-methoxy) propyl acetate (PGMEA) (boiling point 146° C.)

Crosslinking agent: alkoxymethyl melamine-based crosslinking agent
Crosslinking catalyst: sulfonic acid-based acidic catalyst
Crosslinking start temperature: 115° C.

Thereafter, by heating and crosslinking the resist underlying composition under a prescribed condition, the resist underlying film (having a thickness of 10 nm) was formed. 4 minutes was taken to raise the temperature from a room temperature (20° C.) to 200° C., and thereafter the heat treatment was performed for 6 minutes. Thus, the resist underlying film was formed, having the low molecular weight region on the surface side.

Next, the surface of the low molecular weight region of the resist underlying film was coated with the chemically amplified resist ("SLV12M negative resist") by Fuji Film Electronic Materials CO., Ltd, by the spin coating method. By coating of the chemically amplified resist, the mixed component is formed by dissolving the low molecular weight region, on the interface between the low molecular weight region and the resist underlying film. Thereafter, by applying a heat treatment thereto for 10 minutes at 130° C., the resist film (having a thickness of 160 nm) was formed. Further, simultaneously with the formation of the resist film, the mixture film was formed, so as to be interposed between the resist underlying film and the resist film. Thus, the mask blank of example 1 was obtained.

(Manufacture of the Transfer Mask)

Subsequently, a prescribed transfer pattern was formed on the obtained mask blank of example 1, to thereby manufacture the transfer mask. Specifically, the mask blank was exposed by an electron beam, and bake treatment was applied thereto at 120° C. after exposure. Thereafter, by developing the mask blank using the developing solution (tetramethyl amino hydride (TMAH) aqueous solution), the transfer pattern was formed. A dimension (dimension of the space portion) of the transfer pattern was set to 100 nm.

(Evaluation Method)

Evaluation was performed to the mixture film, the mask blank, and the transfer mask.

Figure 4:
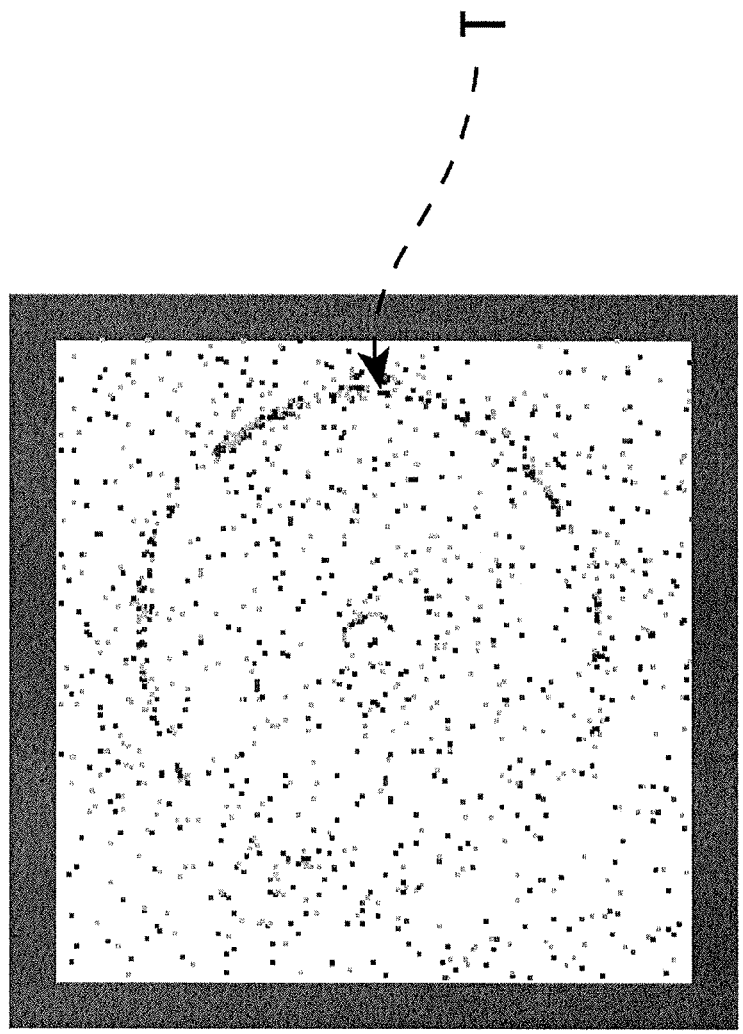
FIG. 4 is a pixel histogram for showing a formation of a mixture film.

Presence/absence of the formation of the mixture film was confirmed as follows. The chemically amplified resist was dropped on the resist underlying film formed under the abovementioned heating condition, which was then crosslinked to thereby form the resist film. Then, the resist film was developed, and for example as shown in a pixel histogram of FIG. 4, whether or not an area in which chemically amplified resist was dropped (area T shown by an arrow in the figure) was gauged in a circular shape. Such a circular gauged portion shows that the resist underlying film was dissolved by the chemically amplified resist and the mixture film was formed by these components.

In order to measure the thickness of the mixture film, multiple numbers of times of the development processing was performed to the manufactured mask blank, and a reduction amount of the thickness (film reduction amount) was measured when the component of the resist film, etc., was not dissolved into the developing solution any more. Since the mixture film was scraped off by development, the reduction amount of the thickness by development corresponds to the thickness of the mixture film.

The resolution was evaluated by forming an isolated line pattern (IL line: space=1:>100)

First, an electron beam irradiation was performed to the formed resist layer, using an electron beam irradiation apparatus. Then, immediately after the irradiation, the resist layer was heated on a hot plate at 120° C. for 10 minutes, and thereafter developed using TMAH having a concentration of 2.38 mass %, and rinsed using pure water, and dried. Thus, the isolated line pattern (IL line: space=1:>100) was formed. An exposure dose was set to 35 $\mu C/cm^2$. A successful case of forming a line having a pattern dimension of 60 nm, was regarded as successful (○), and a failure case of not forming this line was regarded as failure (×).

The defect caused by the foreign matter was evaluated by the number of defects of the manufactured transfer mask. The pixel histogram was measured by an optical measurement method, and a case in which defects (pixels) of 200 nm or less were formed in a high density geometric shape was regarded as failure (×), and a case in which the defects (pixels) were dispersed throughout an entire body with low density was regarded as successful (○).

(Evaluation Result)

Figure 5:
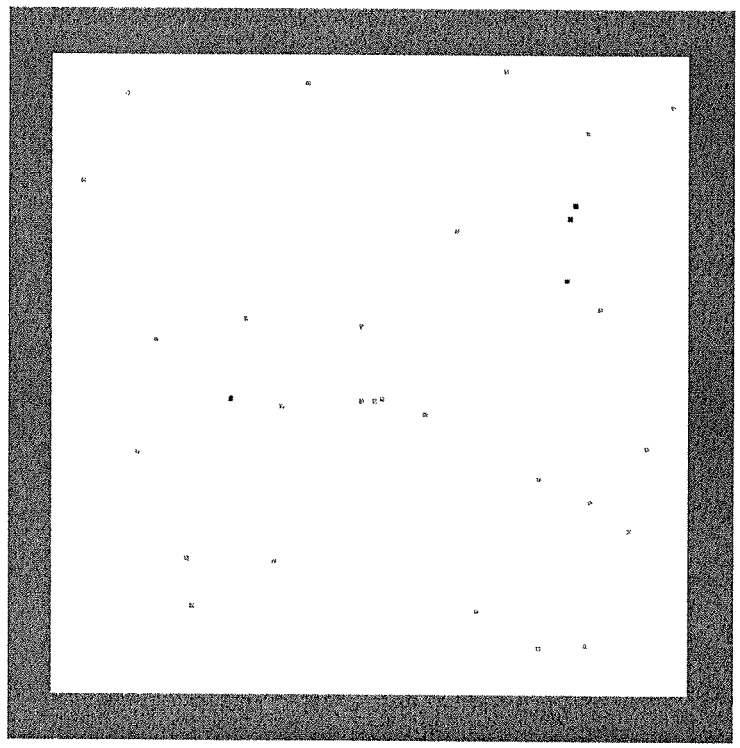
FIG. 5 is a pixel histogram of a mask blank of example 1.

In example 1, the formation of the mixture film was confirmed. The thickness was confirmed as 4.87 nm, because the film reduction amount was 4.87 nm. Further, as shown in the pixel histogram of FIG. 5, it was confirmed that the defect caused by the foreign matter was less with low density. It is considered that this is because the leftovers, etc., of the resist were flowed together with the developing solution in the stage of the development, and there was small number of the leftovers of the resist remained on the substrate in the stage of washing.

The evaluation result is shown in the following table 1.

TABLE 1

| | | Example 1 | Example 2 | Example 3 | Example 4 | Com. Ex. 1 | Com. Ex. 2 |
|---|---|---|---|---|---|---|---|
| Mixture film | Presence/absence | Presence | Presence | Presence | Presence | Absence | Absence |
| | Thickness (nm) | 4.87 | 0.6 | 4.8 | 9.7 | 0 | — |
| | Resolution | ○ | ○ | ○ | ○ | ○ | X |
| | The number of defects | ○ | ○ | ○ | ○ | X | ○ |

Com. Ex. = Comparative Example

Comparative Example 1

In comparative example 1, processing was performed similarly to example 1, excluding a point that the heating condition of the resist underlying composition is changed. Specifically, the resist underlying composition was quickly heated at 200° C., and heated at 200° C. for 10 minutes.

As shown in table 1, in comparative example 1, since the low molecular weight region was not formed in the resist underlying film, it was confirmed that the resist film was remained in the pattern portion or re-adhesion of the leftovers of the resist film occurs, thus causing the defect by the foreign matter to be increased.

Figure 6:
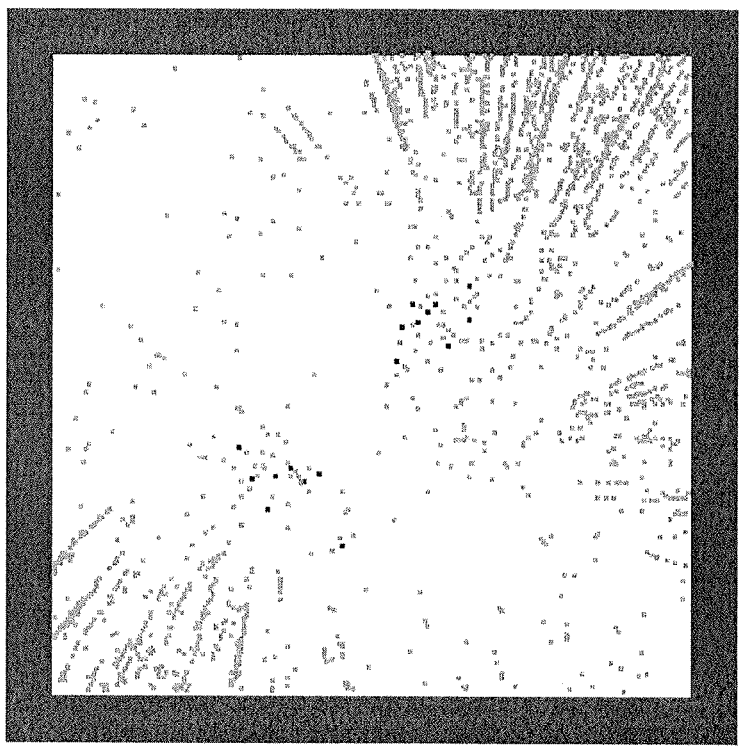
FIG. 6 is a pixel histogram of a mask blank of comparative example 1.
Figure 7:
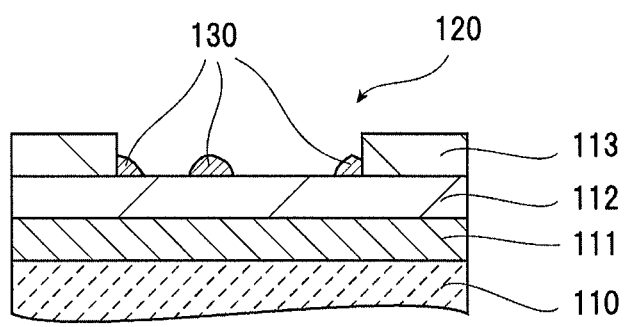
FIG. 7 is a view showing a defect caused by a foreign matter in the mask blank.

Further, as shown in the pixel histogram of FIG. 6, the defect caused by the foreign matter was detected radially from a center of the substrate. The reason can be considered as follows. After the formation of the pattern, the leftovers were washed by a washing liquid, and the substrate was dried by shaking off the washing liquid by a spin rotation. At this time, the leftovers of the resist film are dispersed in the washing liquid supplied on the substrate. It can be considered that the droplet, etc., of the washing liquid is not completely shaken off and dried, and therefore the leftovers of the resist film contained in this droplet forms a radial locus and precipitated on the substrate.

Comparative Example 2

In comparative example 2, the mask blank was manufactured similarly to example 1, excluding a point that the resist film was directly formed on the thin film without forming the resist underlying film.

As shown in table 1, in comparative example 2, the resist underlying film was not formed, and therefore increase of the defect caused by the foreign matter due to the remaining of the resist underlying film, could not be confirmed. However, probably due to the inactivation of the resist film, it was confirmed that the resolution was poor.

Examples 2 and 3

In examples 2 and 3, the mask blank was manufactured similarly to example 1 excluding a point that the content of the crosslinking catalyst contained in the resist underlying composition was changed. Specifically, the content of the crosslinking catalyst in example 2 was set in double of example 1, and the content of the crosslinking catalyst in example 3 was set in half of example 1.

As shown in table 1, in examples 2 and 3, it was confirmed that the resolution was excellent and the defect caused by the foreign matter was less, similarly to example 1. Also, in examples 2 and 3, the content of the crosslinking catalyst was changed, and the thickness of the mixture film was different. Specifically, the thickness of the mixture film was 0.6 nm in example 2, and 4.8 nm in example 3.

Example 4

In example 4, the mask blank was manufactured similarly to example 1, excluding a point that the mixture film of 9.7 nm was formed between the resist underlying film and the resist film, using a coating liquid in which the resist underlying composition and the chemically amplified resist were mixed in the ratio of 1:1 (volume ratio).

Specifically, the surface of the thin film of the substrate was coated with the resist underlying composition, and quickly heated at 200° C. and 200° C. was maintained for 10 minutes for heating, to thereby form the resist underlying film. Next, the surface of the resist underlying film was spin-coated with the abovementioned coating liquid and heated at 150° C., to thereby form the mixture film. Next, the resist layer was formed on the mixture film under a similar condition as the condition of example 1.

When the mask blank of example 4 was patterned to manufacture the transfer mask, the transfer mask blank having high resolution and less defect caused by the foreign matter can be obtained, similarly to other example.

As described above, according to the present invention, by providing the mixture film, the mask blank is obtained, having high adhesion to the resist film and making it difficult for the foreign matter derived from the resist film to remain in the space portion during development and having less defects caused by the foreign matter. Then, the transfer mask having excellent pattern precision can be obtained, from this mask blank.

DESCRIPTION OF SIGNS AND NUMERALS

1 Mask blank
10 Substrate
11 Thin film
12 Resist underlying film
12a Low molecular weight region
13 Resist film
14 Mixture film
20 Space portion
50 Transfer mask

The invention claimed is:

1. A mask blank, comprising:
a thin film for forming a transfer pattern;
a resist underlying film made of a resist underlying composition and provided on the thin film;
a resist film made of a chemically amplified resist and provided on the resist underlying film; and
a mixture film provided so as to be interposed between the resist underlying film and the resist film,
wherein the resist underlying film is configured so that a molecular weight is reduced from the thin film side to the resist film side in a thickness direction, and has a low molecular weight region in which the molecular weight is low on the resist film side surface, and the mixture film is formed by mixing a component of the low molecular weight region and a component of the chemically amplified resist.

2. The mask blank according to claim 1, wherein a thickness of the mixture film is 0.1 nm or more and 10 nm or less.

3. The mask blank according to claim 1, wherein the resist underlying composition contains at least one kind or more of an organic solvent having a boiling point of 100° C. or more.

4. The mask blank according to claim 3, wherein the resist underlying composition contains a crosslinking agent, and a crosslinking start temperature is lower than the boiling point of at least one kind of the organic solvent.

5. The mask blank according to claim 1, wherein the resist underlying composition contains a base polymer and a crosslinking catalyst, and contains 0.05 mass % or more and 10 mass % or less of the crosslinking catalyst based on 100 mass % of the base polymer.

6. A transfer mask, wherein a transfer pattern is formed on the thin film of the mask blank of claim 1.

* * * * *